United States Patent
Kalavade et al.

(10) Patent No.: US 8,072,022 B2
(45) Date of Patent: Dec. 6, 2011

(54) APPARATUS AND METHODS FOR IMPROVED FLASH CELL CHARACTERISTICS

(75) Inventors: Pranav Kalavade, San Jose, CA (US); Krishna Parat, Palo Alto, CA (US); Ervin Hill, Boise, ID (US); Kiran Pangal, Fremont, CA (US)

(73) Assignee: Intel Corporation, Santa Clara, CA (US)

( * ) Notice: Subject to any disclaimer, the term of this patent is extended or adjusted under 35 U.S.C. 154(b) by 376 days.

(21) Appl. No.: 12/317,535

(22) Filed: Dec. 24, 2008

(65) Prior Publication Data

US 2010/0155807 A1    Jun. 24, 2010

(51) Int. Cl.
H01L 29/423    (2006.01)
H01L 29/739    (2006.01)

(52) U.S. Cl. . 257/316; 257/314; 257/315; 257/E29.129; 257/E29.2

(58) Field of Classification Search .................. 257/314, 257/315, 316, E29.129, E29.2
See application file for complete search history.

(56) References Cited

U.S. PATENT DOCUMENTS

| 7,636,257 B2 * | 12/2009 | Lue .......................... 365/185.18 |
| 7,906,806 B2 * | 3/2011 | Rosmeulen .................... 257/316 |
| 2008/0237680 A1 * | 10/2008 | Pangal et al. .................. 257/315 |
| 2009/0140317 A1 * | 6/2009 | Rosmeulen .................... 257/316 |

* cited by examiner

*Primary Examiner* — Victor A Mandala
(74) *Attorney, Agent, or Firm* — Scott M. Lane

(57) ABSTRACT

Embodiments of an apparatus and methods for providing improved flash memory cell characteristics are generally described herein. Other embodiments may be described and claimed.

20 Claims, 4 Drawing Sheets

APPARATUS AND METHODS FOR IMPROVED FLASH CELL CHARACTERISTICS

FIELD OF THE INVENTION

The field of invention relates generally to the field of semiconductor integrated circuit manufacturing and more specifically but not exclusively, relates to flash memory cells comprising a control gate doped with a p-type dopant.

BACKGROUND INFORMATION

A reduction in size of circuit devices (e.g., integrated circuits (IC), transistors, flash memory, resistors, capacitors, etc.) on a semiconductor (e.g., silicon) substrate is typically a major factor considered during design, manufacture, and operation of those devices. In some cases, "scaling" may be used to "scale" down the size or scale of the devices or space from a feature of one device to the similar feature of an adjacent device. For example, during design and manufacture or forming of flash memory devices and other similar electronic devices, it is often desirable to reduce size or scale of (or between) devices, cells, transistors, bit lines (BL), and/or word lines (WL) of those devices. Such flash memory devices or cells may include polysilicon gate oxide transistor devices with floating polysilicon gates.

A n-doped flash memory cell 100 shown in FIG. 1 (Prior Art) illustrates the use of a substrate 110 comprising single crystal silicon that has been etched to form an isolation region 120 using a shallow trench isolation etch process and filled with silicon dioxide to provide electrical isolation. Floating gates 130 are formed on the active region 120 and layered with an interpolydielectric layer 140 such as a silicon oxide, silicon nitride, silicon oxide (ONO) layer stack. An n-doped control gate 150 is formed on the interpolydielectric layer 140 to provide a mechanism to enable flash memory cell operations.

As the pitch between the floating gates 130, or spacing from one floating gate 130 to another floating gate 130 decreases to support cell size reduction or 'shrink', it progressively becomes more difficult to dope the n-doped control gate 150 heavily enough to keep it conductive during flash memory cell operations while avoiding creation of a depletion region 160 adjacent to the interpolydielectric layer 140. A depletion region 160 is an insulating region within a conductive, doped semiconductor material where the charge carriers have diffused away, or have been forced away by an electric field.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein like reference numerals refer to like parts throughout the various views unless otherwise specified.

DETAILED DESCRIPTION

Figure 1:
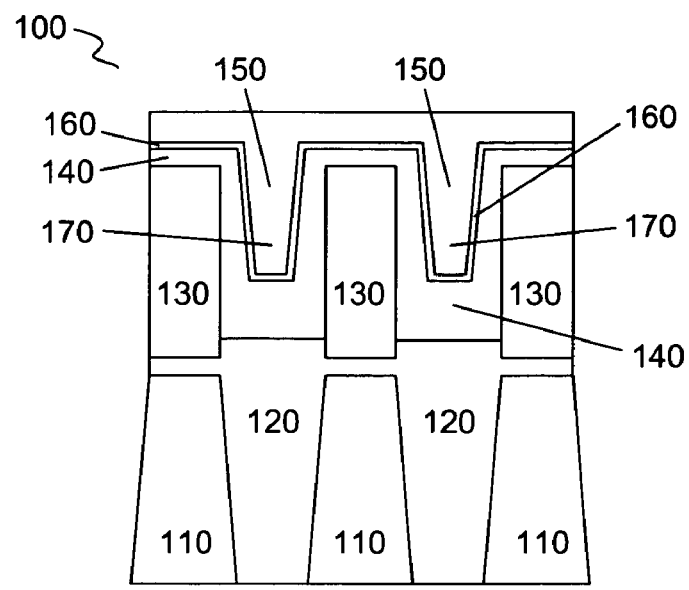
FIG. 1 (Prior Art) is a schematic cross sectional view of a portion of a substrate having a gate electrode and an n-type doped control gate.

Various embodiments of an apparatus and methods for improved flash cell characteristics through the use of p-type doping of control gates are illustrated and described. However, one skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

The performance of non-volatile memory devices, such as flash memory cells, can be improved through implementation of a positively type (p-type) doped control gate. It would be an advance in the art of flash memory cell design and implementation to provide an apparatus and methods for forming a flash memory cell with a p-type control gate to minimize cell to cell interference and to increase endurance of the memory device, particularly as the size of the memory cells continue to decrease in scale and the pitch between the cells is minimized to increase the density of memory cells in a given layout. As an example, use of a p-type dopant in control gate regions of a flash memory cell can provide the combined effect of improving gate coupling ratio, to suppress direct tunneling current between the control gate and active region during an erase cycle, to suppress tunneling of electrons from the control gate to the floating gate, and to provide higher flash memory cell threshold voltage ($V_t$) and program saturation $V_t$.

Figure 2:
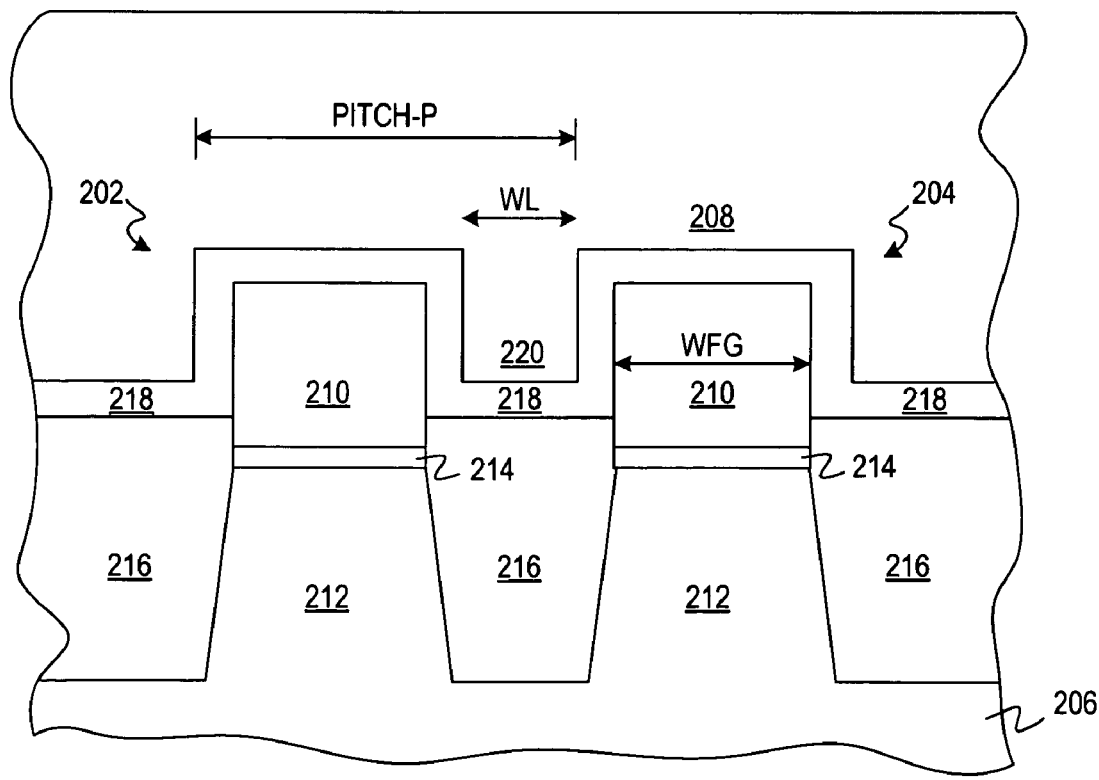
FIG. 2 is a schematic cross sectional view of a portion of a substrate having a gate electrode formed over a channel region in an active region of a transistor.

Now turning to the figures, FIG. 2 shows a cross sectional view of transistor 202 and transistor 204 formed on substrate 206, such as a cross sectional view along word line WL or along p-doped control gate 208 (e.g., the word line may be the control gate layer). The p-doped control gate may be doped with one or more group III elements such as boron (B), aluminum (Al), gallium (Ga) and indium (In) to a concentration substantially between $$5E19 \frac{atoms}{cm^3}$$

and the solid solubility limit for the particular dopant used. If the dopant is implanted, the dopant is annealed for example with a thermal treatment to provide an electrically active p-doped control gate 208 region. The transistors have floating gate 210 over well or active region 212 and tunnel dielectric 214 on active region 212 and below floating gate 210. Isolation regions 216 are shown formed adjacent to, touching, beside or between active regions 212. Isolation regions 216 may be described as trench isolation or shallow trench isolation (STI). FIG. 2 also shows conformal dielectric layer 218 formed on floating gate 210 and isolation regions 216. Conformal dielectric layer 218 may be an inter-poly dielectric. The p-doped control gate 208 layer is formed on conformal dielectric layer 218. The p-doped control gate 208 may be a control gate or word line. Additional transistors similar to transistors 202 and 204 may exist to the left and right of those transistors, such as to form a line of transistors having a cross-section similar to that shown for those transistors.

The p-doped control gate 208 layer illustrated in FIG. 2 is physically separated from the floating gate 210 by the conformal dielectric layer 218. However, the p-doped control gate 208 may be in electrical contact with the floating gate 210 during flash memory cell operations such as during programming or erase operations. For example, for a prior art memory cell illustrated in FIG. 1 (Prior art) with an n-doped control gate 150 under a programming bias, where the control gate is at a very large positive bias relative to the floating gate 130, a significant part of the control gate adjacent the inter-polydielectric layer 140 and between the floating gates 130 can become depleted, resulting in a reduction of electrical coupling between the n-doped control gate 150 and the floating gates 130. The depletion region 160 may expand or grow to partially or substantially consume portions of the n-doped control gate 150 in the control gate fingers 170 of FIG. 1. Further, for flash memory cells consistent with that described in FIG. 1 (Prior art), under a read bias the control gate fingers 170 can become depleted which results in a loss of electrical shielding between the memory cells resulting in an increased cell to cell interference. However, in FIG. 2 for a p-doped control gate 208, a p-doped control gate finger 220 will stay accumulated providing good coupling from the p-doped control gate 208 to the floating gate 210 during programming as well as good shielding between the memory cells during read.

Pitch-P is shown as the pitch between transistors 202 and 204. Thus, a half-pitch may be defined as half of the distance of pitch P, such as a distance from the mid point of the gate of transistor 202 to the midpoint of the space between transistors 202 and 204. Scaling beyond or below 50 nanometers (nm) half-pitch (e.g., between lines or rows of adjacent cells) along the word line may not be possible using prior art methodologies. Specifically, the space between floating gates (FG) of adjacent cells, particularly in the p-doped control gate finger 220 becomes too narrow to keep it conductive during flash memory operations.

Figure 3:
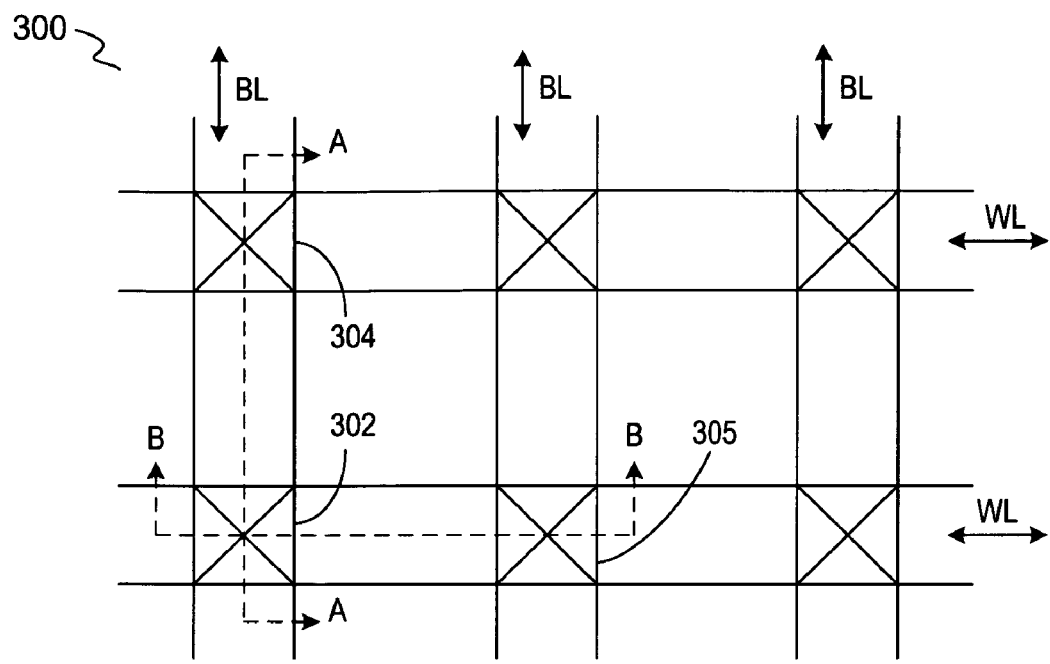
FIG. 3 is a schematic top view of a portion of a substrate showing an array of flash cells arranged along bit lines and word lines.

Flash memory may be organized into a grid or array formation of flash transistors or "cells". FIG. 3 is a schematic top view of a portion of a substrate showing an array of flash cells arranged along bit lines and word lines. FIG. 3 shows array 300 of cells, each located at the intersection of a bit line (BL) and a word line (WL), such as indicated by the box having an "X" at each intersection. Array 300 includes transistors (e.g., cells) 302 and 304 along perspective A-A and transistors (e.g., cells) 302 and 305 along perspective B-B.

Programming of the cells can be done by applying a proper electric field or "bias" across a tunnel dielectric (e.g., dielectric 214), which causes electrons to be stored in the floating gate 210. Similarly, the cells can be erased by applying a proper electric field or "bias" (e.g., a field that has an opposite polarity as compared to the field for programming) across the tunnel dielectric 214, which causes electrons stored in a floating gate to be removed (such as by causing them to tunnel through tunnel dielectric 214 and into active region 212). The electric field may be applied using bit lines (BL) in one direction and word lines (WL) in another direction across lines or rows of cells, or devices. Once programmed, the floating gate 210 may retain the charged data (e.g., a "bit" of data) for a long period of time (e.g., five years) or until it is erased.

Figure 4:
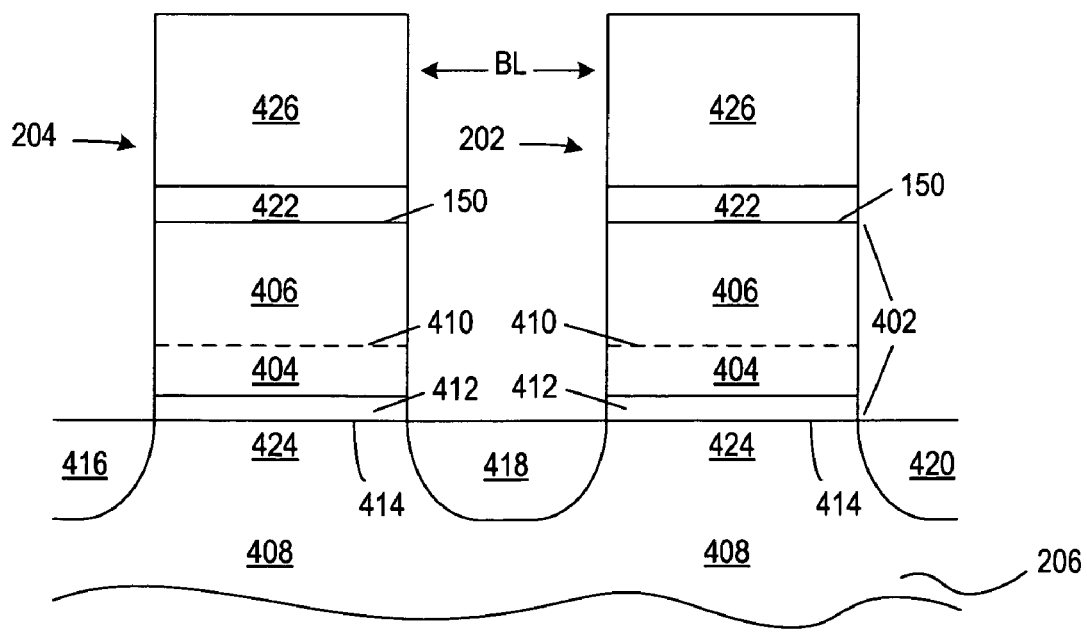
FIG. 4 is a schematic cross sectional view of FIG. 3 through perspective A-A showing a portion of a substrate having a gate electrode formed over a channel region in an active region of a transistor.

FIG. 4 shows a cross sectional view of transistor 302 and transistor 304 along the bit line (BL) of a flash cell array 300 (e.g., along the direction of bit line (BL)). The transistors have floating gate 402 with first portion 404 over well or active region 408 and second portion 406 on surface 410 of first portion 404. For instance, second portion 406 may be described as on, over, above or touching surface 410 and/or first portion 404. FIG. 4 shows tunnel dielectric 412 on surface 414 of active region 408 and below first portion 404. Also, diffusion regions 416, 418 and 420 are shown adjacent to and between active regions 408 of adjacent transistors along the BL. FIG. 4 also shows conformal dielectric layer 422 formed on floating gate 402. Conformal dielectric layer 422 may be an inter-poly dielectric. Conductive material layer 426 is formed on conformal dielectric layer 422. Conductive material layer 426 is a p-doped control gate or word line. Additional transistors similar to transistors 202 and 204 may exist to the left and right of those transistors, such as to form a line of transistors having a cross-section similar to that shown for those transistors.

Figure 5:
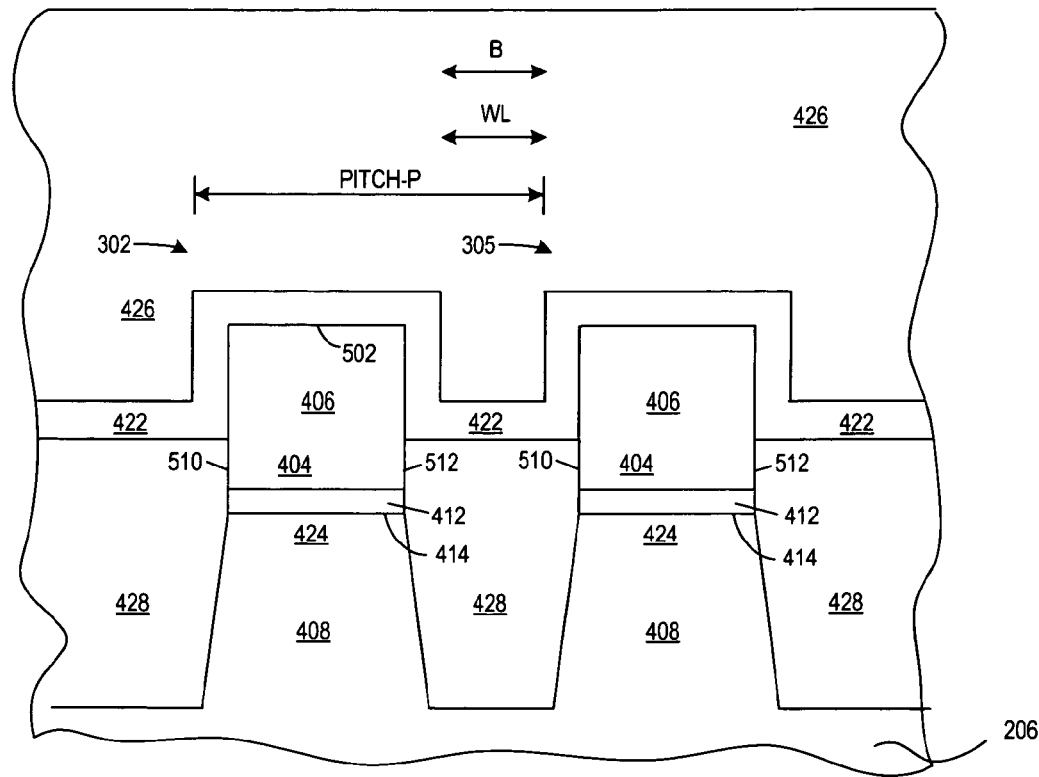
FIG. 5 is a schematic cross sectional view of FIG. 2 through perspective B-B showing a portion of a substrate having a gate electrode formed over a channel region in an active region of a transistor.

FIG. 5 shows a cross sectional view of transistor 302 and transistor 305 such as a cross sectional view perpendicular to the cross section shown in FIG. 4. Thus, FIG. 5 may show a cross sectional view of transistor 302 and transistor 305 along the word line (WL) of a flash cell array (e.g., along the direction of extension of CG layer 208). Thus, pitch P is shown as the pitch between transistor 302 and 305, such as a distance between similar features or surfaces (e.g., sidewalls 163 or 164 of transistors 302 and 305) of the transistors. Thus, a half-pitch would be defined as half of the distance of pitch P.

According to embodiments, first portion 404 is formed on surface 414 of channel 424 of active region 408. Similarly, in some embodiments, first portion 404 may include or be formed on tunnel dielectric 412. Thus, first portion 404 may be described as formed on, over, above or touching tunnel dielectric 412, a top surface of tunnel dielectric 412, surface 414, channel 424, or active region 408. Tunnel dielectric 412 may be described as a tunnel oxide, or a gate dielectric. FIG. 4 also shows conformal dielectric layer 422 formed on floating gate 402 and isolation regions 428. Conformal dielectric layer 422 may be an inter-poly dielectric. Conductive material layer 426 is formed on conformal dielectric layer 422. Conductive material layer 426 is a p-doped control gate or word line. Isolation regions 428 are shown formed adjacent to, touching, beside or between active regions 408, tunnel dielectric 412, and first portion 404. Isolation regions 428 may be described as trench isolation or shallow trench isolation (STI).

Transistor 302 is shown in FIG. 4 having diffusion regions 418 and 420, such as junction regions or source/drain regions adjacent to and/or touching surface 414, channel 424 and/or active region 408. Accordingly, channel 424 may be a channel and/or have top surface 414 with four sides, such as two sides disposed towards, adjacent to, or touching regions 418 and 420; and two sides adjacent, disposed towards, or touching isolation regions 428. Thus, when properly biased; such as by applying a proper bias voltage to program or store a charge in floating gate 402, a field may be set up under tunnel dielectric 412 to allow charged carriers to travel between region 418 and 418, such as to allow the cell to be read to identify existence of the charge. Diffusion regions 418 and 420 may be described as formed on or in active region 408. Similarly, floating gate 402 and/or dielectric 412 may be described as formed on, over, or in substrate 206. Transistor 305 may be a transistor similar to the descriptions herein for transistor 302 (including as shown and described for FIG. 4).

Transistors 302, 304, and 305 may be part of an array of flash memory device cells. Programming of the cells can be done by applying a proper electric field or "bias" across a tunnel dielectric 412, which causes electrons to be stored in a floating gate portion 406. Similarly, the cells can be erased by applying a proper electric field or "bias" (e.g., a field that has an opposite polarity as compared to the field for programming) across the tunnel dielectric 412, which causes electrons stored in a floating gate portion 406 to be removed, such as by causing them to tunnel through tunnel dielectric 412 and into active region 408.

Substrate 206 may be a polycrystalline or single crystal structure of one or more semiconductor materials, such as silicon, silicon germanium, and/or another semiconductor material. Substrate 206 may be formed from, deposited with, or grown using various suitable technologies for forming a semiconductor base or substrate, such as a silicon wafer. Substrate 206 may form by chemical vapor deposition (CVD), atomic layer deposition (ALD), blanket deposition, epitaxial deposition, or other similar forming processes. Substrate 206 may be a relaxed, non-relaxed, graded and/or non-graded semiconductor material. Substrate 206 may also be under a strain, such as a tensile or compressive strain. Descriptions above for substrate 206 also apply to active region 408 and channel 424.

In some embodiments, substrate 206 may be considered a semiconductor "bulk" layer, such as where isolation regions 428 are required to electrically isolate transistor 302 from transistor 305 and/or other adjacent electronic devices on or in substrate 206. Alternatively, in some cases, substrate 206 may be a semiconductor on insulator (SOI) substrate, such as wherein insulator layer (not shown) may be disposed between substrate 206 and active region 408 (e.g., between substrate 206 and channel 424, and regions 418 and 420).

Isolation regions 428 are shown formed adjacent to, touching, beside or between active regions 408, and/or channels 424. Isolation regions 428 may be described as trench isolation or shallow trench isolation (STI). Isolation regions 428 may be formed of one or more insulator materials such as dielectric material, oxide material, silicon dioxide, silicon oxy-nitride, tunnel oxide, semiconductor oxide material, or other insulator material formed on or in substrate 206. In some cases, forming isolation regions 428 may be include etching a trench in substrate 206 and filling the trench with insulator material. The trench may be filled using one or more plasma processes (e.g., high density plasma oxide), thermal processes (e.g., to form thermally grown oxide), and the like to grow or deposit the insulator material to a certain thickness in all of the trenches, at once. Thus, transistor 302, or components thereof, may be electrically isolated from adjacent transistors (e.g., transistor 305 and/or transistors further distal than region 428 from channel 424), but may or may not be electrically isolated from substrate 206.

Also, tunnel dielectric 412 may be an insulator such as described for isolation region 428, an insulator known for a tunnel dielectric, and the like. In some cases, tunnel dielectric 412 may be or include a thermally grown silicon dioxide (SiO2), or other tunnel high quality dielectric type material.

The thickness or height of dielectric 412, first portion 404, and/or second portion 406 may each be generally consistent throughout and conform to the topography of surface 414.

Transistors 302 and 305 and components thereof may be further processed, such as in a semiconductor transistor fabrication process that involves one or more processing chambers to become part of "flash" memory, a NMOS transistor, a flash cell and the like. For example, a bit line (BL) or other interconnect or conductor may be formed to (e.g., to a top surface of) region 418, and/or region 420. Also, a word line (WL) or other conductor may be formed conformally over or above gate electrode 402 (e.g., separated from top surface 502 of second portion 406 by conformal dielectric layer 422).

First portion 404 and/or second portion 406 may be formed of semiconductor material, conductive material, such as silicon, single crystal silicon, polycrystal silicon, and the like. Portion P1 and P2 may be considered a P1 polysilicon material. In some cases, portion 404 and/or 406 may be more than one layer of different materials. Alternatively, in some cases, portion 404 and 406 may be the same material. Portion 404 and/or 406 may be formed by a process as described for tunnel dielectric layer 412. For instance, at surface 410, material of second portion 406 may be on, or touching material of first portion 404. In some embodiments, portion 406 may be a material densified by annealing to reduce voids, defects, or non-crystal bonds in the material. Also, portion 406 may have top surface 502 polished by a chemical mechanical polishing (CMP) process.

Conformal dielectric layer 422 may be a layer of insulator material, dielectric material, material described for isolation regions 428, and ILD material, and/or other inter-poly dielectric (IPD) material. According to embodiments, conformal dielectric layer 422 may include a polycrystalline or single crystal dielectric or insulator layer of one or more materials, such as silicon oxide, silicon nitride, and/or the like. Also, conformal dielectric layer 422 may be described as an inter-poly dielectric layer, such as one or more layers of high k dielectric material. In some cases, conformal dielectric layer 422 may represent three layers of material, such as a layer of silicon oxide on or touching a layer of silicon nitrate which is on or touching a different layer of silicon oxide. Each of these layers may be approximately five nanometers in thickness resulting, in this example, in a 15 nm thick conformal dielectric layer 422.

Conductive material layer 426 may be a word line (e.g., a control gate (CG) polyword line), such as a layer of conductor or semiconductor material. Conductive material layer 426 may include poly-silicon, conductive material, and the like for forming a WL, CG, or control gate polyword line. In some cases conductive material layer 426 may be described as a P2 polysilicon material (e.g., while gate electrode 402 is a P1 polysilicon material). In a flash memory cell operation with a p-type doped conductive material layer 426, for example during an erase operation, electron tunneling current can be significantly reduced that would otherwise occur while the substrate 206 is positively biased with respect to the conductive material layer 426, thereby minimizing or eliminating reliability concerns due to degradation.

Where conductive material layer 426 is a conductive metal, floating gate 402 may have smaller widths and heights. Thus, conductive material layer 426 may be used to simultaneously bias gate electrodes 402 of transistors 302 and 305 to activate transistor 302 and 305, such as to program or erase those transistors. For instance, it may be beneficial or desired to erase transistor 302 and 305 simultaneously where those transistors are flash cells of a flash memory, and/or other non-volatile memory. Also, the bit lines and be used to program or erase each of those transistors independently.

Floating gate 402 may be a gate electrode insulated from word line conductive material layer 426 by conformal dielectric layer 422 and/or insulated from channel 424 (and from active region 408) by tunnel dielectric 412. Thus, floating gate 402 may hold a charge for a long period of time. This charge may be maintained for five years, or until conductive material layer 426 is erased, such as with a bias opposite that used to program it, thus, resetting or removing (e.g., to lower) a threshold voltage at which the cell turns on.

Figure 6:
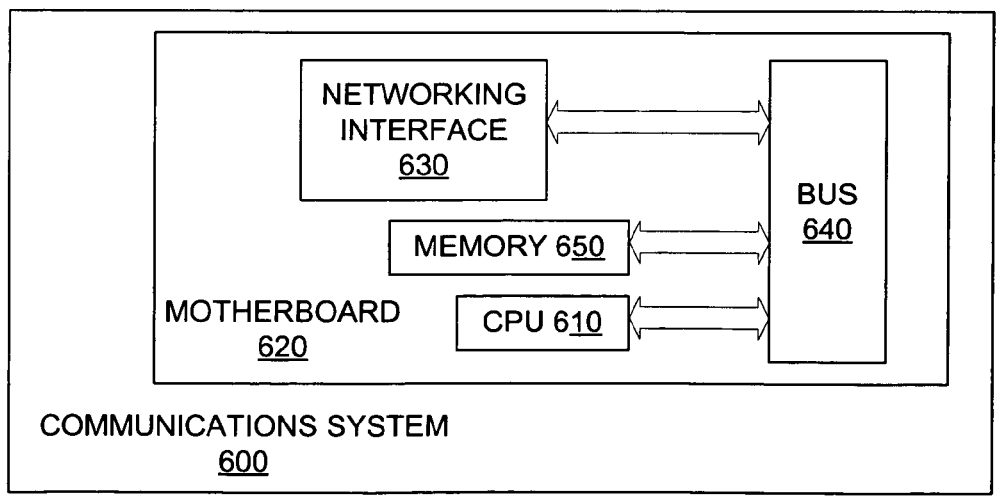
FIG. 6 illustrates a communications system comprising a memory with a p-type doped control gate.

FIG. 6 illustrates a communications system 600 comprising a memory 650 with a p-type doped control gate region as illustrated in FIGS. 2-5, in accordance with one embodiment. The communications system 600 may include a motherboard 620 with the CPU 610, a memory 650 and a networking interface 630 coupled to a bus 640. More specifically, the memory 650 may comprise the p-type doped control gate region and/or its method of fabrication. Depending on the applications, the communications system 600 may additionally include other components, including but are not limited to volatile and non-volatile memory, a graphics processor, a digital signal processor, a crypto processor, a chipset, mass storage (such as hard disk, compact disk (CD), digital versatile disk (DVD) and so forth), and so forth. One or more of these components may also include the earlier described graded high germanium content silicon-germanium region and/or its method of fabrication. In various embodiments, communications system 600 may be a personal digital assistant (PDA), a mobile device, a tablet computing device, a laptop computing device, a desktop computing device, a set-top box, an entertainment control unit, a digital camera, a digital video recorder, a CD player, a DVD player, or other digital device of the like.

Figure 7:
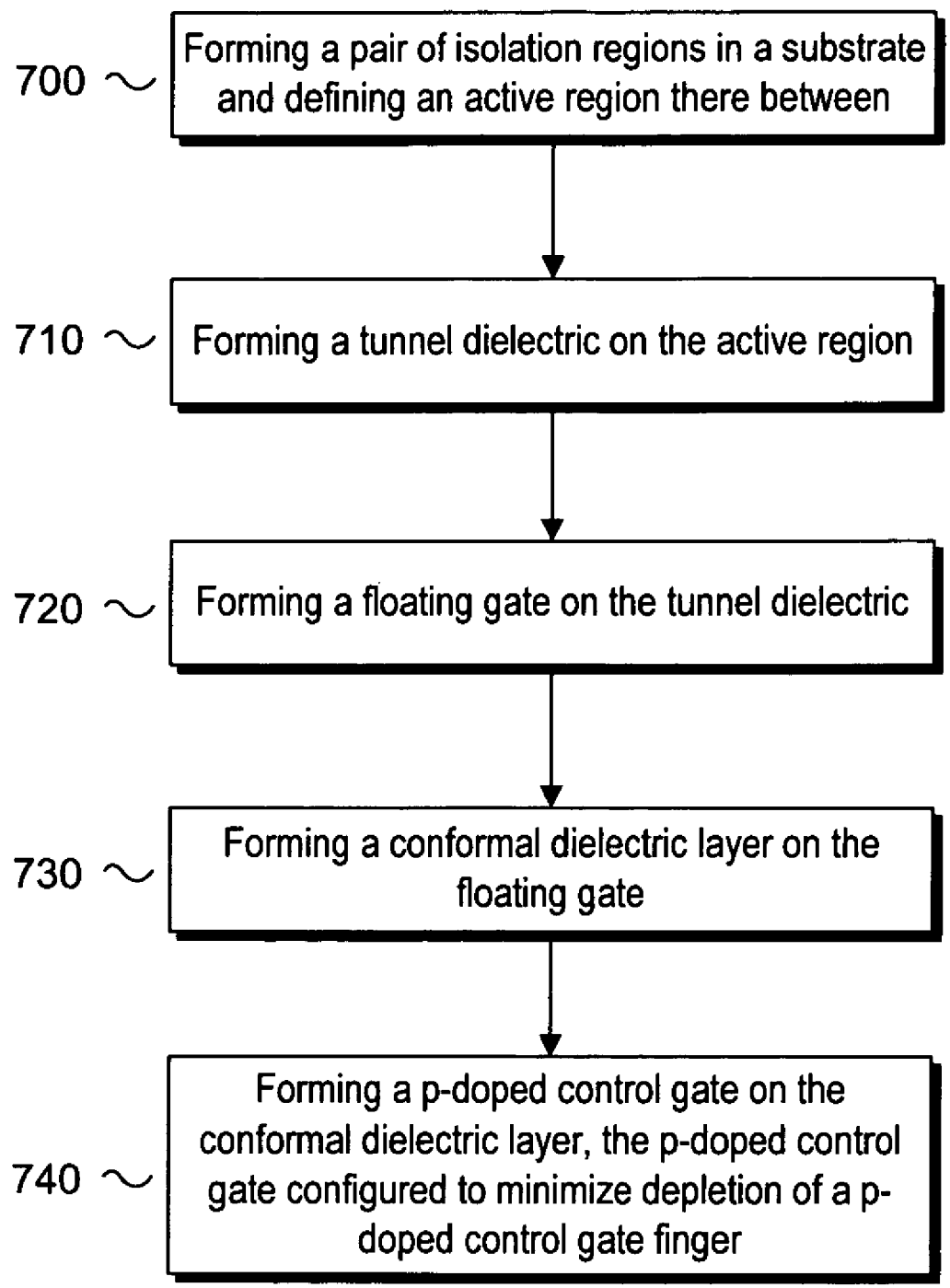
FIG. 7 is a flowchart describing one embodiment of a fabrication process used to form a p-type doped control gate in a memory cell.

FIG. 7 is a flowchart describing one embodiment of a fabrication process used to form a flash memory cell with a p-doped control gate 208. In element 700, a pair of isolation regions 216 are formed in a substrate 206 and an active region 212 is defined between the isolation regions 216. A tunnel dielectric 214 is formed on the active region 212 in element 710. A floating gate 210 is formed on the tunnel dielectric 214 in element 720. In element 730, a conformal dielectric layer 218 is formed on the floating gates 210. A p-doped control gate 208 is formed on the conformal dielectric layer 218 in element 740 wherein the p-doped control gate 208 is configured to minimize depletion of a p-doped control gate finger 220 during flash memory cell operations such as programming, erase, and/or read.

The foregoing description of the embodiments of the invention has been presented for the purposes of illustration and description. It is not intended to be exhaustive or to limit the invention to the precise forms disclosed. This description and the claims following include terms, such as left, right, top, bottom, over, under, upper, lower, first, second, etc. that are used for descriptive purposes only and are not to be construed as limiting. For example, terms designating relative vertical position refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and still fall within the meaning of the term "top." The term "on" as used herein (including in the claims) does not indicate that a first layer "on" a second layer is directly on and in immediate contact with the second layer unless such is specifically stated; there may be a third layer or other structure between the first layer and the second layer on the first layer. The embodiments of a device or article described herein can be manufactured, used, or shipped in a number of positions and orientations.

Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. A method of forming a memory cell, comprising:
   forming an active region on a substrate;
   forming a tunnel dielectric on the active region;
   forming a floating gate on the tunnel dielectric, wherein the floating gate comprises a first portion and a second portion;
   forming continuous isolation regions on the substrate directly adjacent to the active region, the tunnel dielectric, and along a side the first portion of the floating gate;
   forming a conformal dielectric layer directly adjacent to the floating gate and the isolation regions, and;
   forming a p-doped control gate on the conformal dielectric layer and between the floating gates, wherein the p-doped control gate extends below a top surface of the floating gate.

2. The method of claim 1, wherein the p-doped control gate is doped with a group III element of the group consisting of boron (B), aluminum (Al), gallium (Ga) and indium (In).

3. The method of claim 2, wherein the p-doped control gate is doped between 5E19 atoms/cm^3 and the solid solubility limit.

4. The method of claim 1, further comprising thermally annealing the p-doped control gate.

5. The method of claim 1, further comprising applying a bias across the tunnel dielectric to store electrons in the floating gate.

6. The method of claim 5, wherein the memory cell is programmed without forming a depletion region across the p-doped control gate that extends below the top surface of the floating gate.

7. The method of claim 1, wherein a space between the floating gate and a second floating gate is substantially equal to 50 nm or less.

8. A non-volatile memory, comprising:
an isolation region on a substrate;
a tunnel dielectric on the active region;
a floating gate on the tunnel dielectric;
an isolation region on the substrate directly adjacent to the active region, the tunnel dielectric, and along a side of a portion of the floating gate;
a conformal dielectric layer directly adjacent to the floating gate and the isolation region;
a p-doped control gate on the dielectric layer and between the floating gate wherein the p-doped control gate extends below a top surface of the floating gate to provide a p-doped control gate finger between the floating gate and a second floating gate.

9. The non-volatile memory of claim 8, wherein the p-doped control gate is doped with a group III element of the group consisting of boron (B), aluminum (Al), gallium (Ga) and indium (In).

10. The non-volatile memory of claim 9, wherein the p-doped control gate is doped between 5E19 atoms/cm^3 and the solid solubility limit.

11. The non-volatile memory of claim 8, wherein the p-doped control gate is thermally annealed.

12. The non-volatile memory of claim 8, the floating gate further comprising a first portion and a second portion.

13. The non-volatile memory of claim 12, wherein the isolation region is formed along a side of the first portion of the floating gate.

14. A communications system, comprising:
a motherboard;
a central processing unit; and
a memory, the memory comprising;
a pair of spaced apart isolation regions formed in a substrate and defining a substrate active region there between;
a tunnel dielectric formed on the active region;
a floating gate formed on the tunnel dielectric;
a dielectric layer on the floating gates and the isolation regions, wherein the dielectric layer is directly adjacent to a top surface of the floating gate and along sides of the floating gate and wherein the isolation regions are positioned directly adjacent to a portion of the floating gate;
a p-doped control gate on the dielectric layer and between the floating gate and another floating gate positioned on another active region and tunnel dielectric, wherein the p-doped control gate is positioned below the top surface of the floating gate.

15. The communications system of claim 14, wherein the p-doped control gate is doped with a group III element of the group consisting of boron (B), aluminum (Al), gallium (Ga) and indium (In).

16. The communications system of claim 14, wherein the p-doped control gate is doped between 5E19 atoms/cm^3 and the solid solubility limit.

17. The communications system of claim 14, wherein the p-doped control gate is thermally annealed.

18. The communications system of claim 14, wherein the communications system is selected from the group consisting of a mobile device, a tablet computing device, a laptop computing device, a desktop computing device, a set-top box, an entertainment control unit, and a digital camera.

19. The communications system of claim 14, wherein a space between the floating gates is substantially equal to 50 nm or less.

20. The communications system of claim 14, wherein the p-doped control gate comprises polysilicon.

* * * * *